United States Patent [19]

Gulla et al.

[11] Patent Number: 4,869,970
[45] Date of Patent: Sep. 26, 1989

[54] RADIATION ATTENUATION SHIELDING

[75] Inventors: Michael Gulla, Newton; Terrell A. Benjamin, Acton; Mark Farsi, Worcester, all of Mass.

[73] Assignee: Shipley Company Inc., Newton, Mass.

[21] Appl. No.: 118,439

[22] Filed: Nov. 9, 1987

Related U.S. Application Data

[62] Division of Ser. No. 885,468, Jul. 14, 1986.

[51] Int. Cl.$^4$ .............................................. B32B 15/04
[52] U.S. Cl. .................................. 428/621; 428/675; 428/678; 428/680; 174/35 MS
[58] Field of Search ............... 428/621, 666, 667, 675, 428/678, 680; 174/35 MS

[56] References Cited

U.S. PATENT DOCUMENTS

| | | | |
|---|---|---|---|
| 3,832,168 | 8/1974 | Gulla | 428/680 |
| 4,169,171 | 9/1979 | Narcus | 427/264 |
| 4,514,586 | 4/1985 | Shirose et al. | 174/35 MS |
| 4,725,504 | 2/1988 | Knudsen et al. | 428/675 |

OTHER PUBLICATIONS

*Engineering*, 9, Dec. 1966, pp. 1026 and 1027.
*Plating*, 56, 382–384 (1967).
*Modern Plastics*, Sep. 82, pp. 48–51.
*Industrial Finishing*, May, 1983, pp. 16–18.

*Primary Examiner*—L. Dewayne Rutledge
*Assistant Examiner*—George Wyszomierski
*Attorney, Agent, or Firm*—Robert L. Goldberg

[57] ABSTRACT

An electromagnetic radiation attenuating coating comprising an electronic housing base material coating with a first electroless metal alloy of copper, a member from the group of nickel, cobalt and mixtures of nickel and cobalt, and phosphorus rich in copper and a second electroless metal alloy of copper, a member from the group of nickel, cobalt and mixtures of nickel land cobalt, and phosphorus rich in nickel. The coating provides superior radiation attenuation and comprises fewer processing steps in its formation.

12 Claims, 1 Drawing Sheet

SUBSTRATE

SUBSTRATE

SUBSTRATE

RADIATION ATTENUATION SHIELDING

This is a co-pending application Ser. No. 06/885,468 filed on July 14, 1986

BACKGROUND OF THE INVENTION

1. Introduction

This invention relates to electromagnetic containment using shielding comprising a non-conducting substrate coated with multiple coatings of an autocatalytic electroless metal alloy of copper, phosphorus and a member from the group of cobalt, nickel and mixture of cobalt and nickel and to processes for making of the same.

2. Description of the Prior Art

Electromagnetic interference (EMI) radiation is undesirable energy emissions within a frequency range of from less than 60 Hz to more than 1,000 MHz. Radio frequency interference (RFI) is the portion of EMI radiation in about the 0.01 to 1,000 MHz range.

EMI radiation is created by operation of many diverse forms of electronic equipment ranging from microwave equipment to home computers. The radiation occurs because electronic devices emit "noise" in the above frequency range that is picked up by other devices or by conduction through power lines that act as antennas. EMI radiation may interfere with other devices and has been known to cause such diverse problems as interference with police mobile radios, communication systems, scientific test equipment, and cardiac pacemakers.

In recent years, the use of electronic equipment in the home and work place has grown rapidly; correspondingly EMI emissions have increased. Additionally, most housings for electronic equipment are now fabricated from plastic rather than metal. Plastics are lighter, more versatile, and less expensive than metal; however, they do not possess the intrinsic EMI/RFI shielding capabilities provided by metal enclosures.

The Federal Communications Commission (FCC) has published a series of regulations concerning standards for maximum allowable EMI emissions for electronic devices. The regulations, which became effective in October 1983, apply to all digital electronic products that use or generate frequencies between 10 KHz and 1,000 MHz. These regulations therefore include commercial, industrial, business, and home products such as computers, calculators cash registers, electronic typewriters, video equipment, and electronic games. The regulations require that the electronics industry develop electronic devices which have electromagnetic compatibility (EMC); in other words, equipment which neither interferes with other devices nor is itself susceptible to interference One approach to limiting electromagnetic containment is the use of an EMI shield to contain the radiation. Containment requires special shielding materials, components, and structures which prevent generated energy from escaping and acting as a source of disturbance.

The effectiveness of electromagnetic containment is determined by the degree to which the field strength is attenuated as a result of reflection or absorption by the shielding material. Shielding efficiency (SE) is calculated as a logarithmic function of the ratio of unshielded EMI transmission to shielded EMI transmission and is expressed in decibels. Because of the logarithmic nature, an increase of 30 decibels in SE for a given wavelength or frequency of electromagnetic radiation represents a 1,000 percent increase in the shielding efficiency of the coating. A coating with a shielding efficiency of 30 db, for example, eliminates 99.9% of the total EMI radiation. A 60 db coating eliminates 99.9999% of the total EMI radiation.

There are several shielding methods in use. The method most often used involves a metallic coating applied over a plastic housing for the electronic device. An early publication showing the use of multiple metal coatings over a plastic housing is Engineering, 9, Dec., 1966, pp. 1026 and 1027. Methods for applying metallic coatings disclosed in this reference include galvanic deposition, spray coating, chemical metalizing and vacuum metalizing. Metal coatings include copper, silver, chromium, nickel, silver, gold, zinc, etc.

Metals are applied over housings for electronic equipment in a number of ways. For example, EMI shielding materials have been arc-sprayed (zinc) and painted with metal-containing paints (nickel) onto the electronic housings. Both of these methods have serious disadvantages. Arc-sprayed zinc is an effective EMI shield with attenuation to 120 db or more. However, zinc is toxic and expensive, the procedure is labor intensive, and the coating is prone to cracking and peeling. Conductive nickel paints are easier to apply than arc-sprayed coatings, but do not cover recessed areas, provide attenuation to only 20 to 60 dbs and often require multiple coatings.

Silver and copper conductive paints have also been used in the manufacture of EMI shielding. Silver is a good conductor, but is expensive and oxidizes. Copper conductive paints are easy to apply, economical, used with conventional equipment, are wear resistant and have good resistance to flaking. However, copper tends to oxidize which results in a loss of conductivity and a concomitant loss of shielding effectiveness.

Other methods for applying metallic coating include cathode sputtering and vacuum metalizing. Such coatings show good conductivity and good adhesion, but require expensive equipment for application, are prone to microscopic cracking, can distort thermoplastics, require high power, are batch operations and are limited by part configuration.

Recently, interest has been generated in the use of electroless metals for EMI shielding. Electroless plating of surfaces for EMI shielding is shown in the prior art as early as 1967. Lordi, *Plating*, 54, 382, (1967), incorporated herein by reference, discusses the use of both electroless copper and electroless nickel as shielding materials. Lordi discusses electronic applications for electroless copper and electroless nickel specifically noting EMI shielding, teaches that electroless nickel can be used as an intermediate coating over copper to prevent corrosion and finally, that electroless copper can be protected by a coating of a second metal to prevent oxidation.

Recently, a number of publications have discussed the use of electroless metals for EMI applications. *Plastics Technology, Vol.* 27, June '81, p.67, teaches the use of electroless metals as EMI shielding materials. *Plastics World*, Vol. 40, p.40–45, September 1982 states that electroless plating may be less expensive than many of the shielding processes now in use and can give comparable shielding performances. The economy of application of electroless plating for EMI shielding is demonstrated in a 1982 article in *Industrial Finishing*, Vol. 58, pp 100 to 101. Smoluk, *Modern Plastics,* September '82, p. 48–51 cites several commercially available electroless plating systems for shielding applications. Smoluk reports electroless copper coatings with demonstrated SE values of 80 to 116 db, and electroless nickel coatings with SE values exceeding 45 db.

As discussed in the literature, both electroless copper and electroless nickel have been used in the electroless plating of plastic substrates. Both have advantages and disadvantages. Copper, with a relative conductivity of 1.0 (second only to silver with a conductivity of 1.05), has high shielding effectiveness. An additional advantage of copper is a relatively low cost. Disadvantages of copper are relatively low abrasion (wear) resistance and a relatively poor corrosion resistance with a strong tendency to oxidize which significantly reduces the shielding effectiveness.

Electroless nickel serves as a good paint base, has high wear resistance, stable electrical contact resistance, good solderability, and good corrosion resistance. *Plastic Design Forum,* November/December 1982, pp. 17–26, states that while electroless nickel is less conductive than electroless copper and therefore less effective as a shielding material, it possesses better corrosion resistance and may be preferable to electroless copper for EMI shielding applications, especially in severe environmental conditions. The major disadvantage of electroless nickel is its low relative conductivity of 0.20 or less. However, electroless nickel is relatively expensive and therefore, high cost is a disadvantage to the use of electroless nickel as a shielding material.

Disadvantages attendant to the use of electroless copper and electroless nickel separately as shielding materials are partly overcome by a dual layer of electroless copper overplated with electroless nickel. Such a dual layer is believed to be first suggested by Lordi (supra) in 1967. In 1983, Krulik, in *Industrial Finishing,* May, 1983, pp. 16–18, states that "the (electroless) copper's disadvantages are overcome by coating the copper layer with a thin layer of electroless nickel. The electroless nickel is deposited to protect the copper. The nickel's relative high cost is minimized by the thinness of the layer." A 1983 article by Hadju and Krulik in *Plating and Surface Finishing,* July, 1983, pp. 42–44, states that "a composite coating of electroless copper with a top layer of electroless nickel will combine the desirable characteristics of both. There is no degradation of the excellent shielding properties of electroless copper which can be adjusted in its shielding efficiency by varying its thickness. A relatively thin coating of electroless nickel provides corrosion resistance, paint adhesion, stable low electrical contact resistance, and other desirable properties and may be maintained at a constant thickness". A dual layer of electroless copper coated with electroless nickel is also disclosed in U.S. Pat. No. 4,514,486 incorporated herein by reference. This configuration utilizes the high conductivity of the electroless copper for EMI attenuation and the corrosion resistance of the electroless nickel to protect the copper against oxidation.

Processes and compositions for plating electroless nickel over copper surfaces including electroless copper surfaces are known in the prior art and are described in numerous publications including U.S. Pat. No. 4,002,778 incorporated herein by reference. This patent teaches a process for plating electroless nickel onto copper circuit boards by pretreating the materials with a reducing agent such as sodium borohydride prior to chemical plating. Another patent involving multiple electroless metal coatings is U.S. Pat. No. 4,169,171 incorporated herein by reference. This patent teaches the application of electroless nickel over electroless copper for bright and decorative coatings. Gallis, *Plastic Design Forum,* November/December 1983, states that in electroless plating, the usual routine is copper followed by a flash of a very thin layer of a nickel topcoat. In this article, Gallis also discloses a recently introduced electroless copper and electroless nickel system which incorporates optional, corrosion resistant topcoats to achieve the specific surface properties desired.

Briefly, electroless plating of plastics comprises immersing a part in a series of baths which prepare the surface of the part for deposition of an adherent metallic layer on the surface of the part. Following preparation of the part, it is immersed in an electroless plating solution where plating takes place by chemical reduction of a dissolved metal in the presence of a catalytic surface.

Conventional methods of electroless plating onto dielectric substrates require that the surface be catalyzed prior to deposition of the metallic coating. Colloidal solutions containing noble metals have been used in electroless plating systems to render non-conductive surfaces catalytic to deposition of the dissolved metal. An example of a noble metal catalyst is disclosed in U.S. Pat. No. 3,011,920 incorporated herein by reference. The patent teaches treatment of the dielectric substrate with a colloidal palladium solution to render it catalytic to deposition of the dissolved metal.

Conductive surfaces such as metallic surfaces also may be plated with electroless metal deposits. Though conductive, most metal surfaces are not catalytic to electroless metal deposition and typically, such surfaces must be activated before deposition from an electroless solution may be initiated. In similar fashion, electroless metal deposits are not catalytic to a second electroless deposit. For example, electroless copper must be activated to electrolessly deposit a second electroless metal such as electroless nickel. Consequently, if one desires to form a dual layer of electroless copper coated with electroless nickel, such as in the manufacture of EMI shielding, it is necessary to activate the electroless copper prior to deposition of electroless nickel from an alkaline hypophosphite solution. This increases the processing line and the costs of manufacture.

SUMMARY OF THE INVENTION

The present invention is directed to electromagnetic containment using EMI shielding comprising multiple layers of an alloy of copper, phosphorus and a member from the group of nickel, cobalt and mixtures of nickel and cobalt where the layer in contact with the base material of an electronics housing is rich in copper and the top layer removed from the base layer is rich in nickel and/or cobalt. The invention is also directed to an electroless plating process for formation of such multiple layers comprising fewer processing steps and resulting in an EMI coating having corrosion resistance improved over the EMI coatings of the prior art.

The electroless alloy coatings of copper, phosphorus and nickel and/or cobalt utilized in the practice of the subject invention are deposited from an autocatalytic plating solution comprising a plating metal that is a mixture of copper and nickel and/or cobalt, a reducing agent that is a salt of hypophosphite which also is the source of phosphorus in the deposit, and an autocatalytic promoter to initiate electroless metal deposition.

Copper, cobalt and nickel deposit from the above described solutions at unequal rates, and based upon the relative concentrations of the metals within the plating solution, can be controlled to provide deposits varying from rich in nickel and/or cobalt to rich in copper. Therefore, in one embodiment of the invention, a single electroless deposit may comprise a metal deposit having a gradient varying outward from the electronic base material of high copper concentration to high nickel and/or cobalt concentration in which case, the number of layers comprising the EMI shielding layer is infinite.

Electroless deposits from the above described solutions are autocatalytic to each other and a part may be removed from a plating solution having a high concentration of one metal (such as copper) and immersed in another solution having a high concentration of the other metal (nickel and/or cobalt) without the part requiring a step of activation to initiate metal deposition. This is a departure from the prior art where conventionally a part removed from solution must be activated before it becomes catalytic to further metal deposition or even before it can be electrolytically plated with nickel. Therefore, in a second embodiment of the invention, a part may have a copper rich layer deposited from a first electroless solution and a nickel and/or cobalt rich layer deposited from a second electroless solution without the requirement for a step of activation between deposits.

In a further embodiment of the invention, the top surface of nickel, cobalt or an alloy of the two is rinsed with a solution containing chrome$^6$ +ions to form a conversion coating that significantly increases corrosion resistance of the part.

EMI shielding comprising the electroless alloy of copper coated with nickel primarily acts as shielding by reflection. It is a further discovery of the invention that the use of cobalt in place of nickel or in combination with nickel provides the further advantage of imparting magnetic properties to the deposit. It is known that magnetic materials contain electromagnetic radiations by adsorption. Therefore, using cobalt as the top layer, or cobalt in combination with nickel as the top layer, further operates to contain electomagnetic radiation within the enclosure.

DESCRIPTION OF THE PREFERRED EMBODIMENTS

Figure 1:
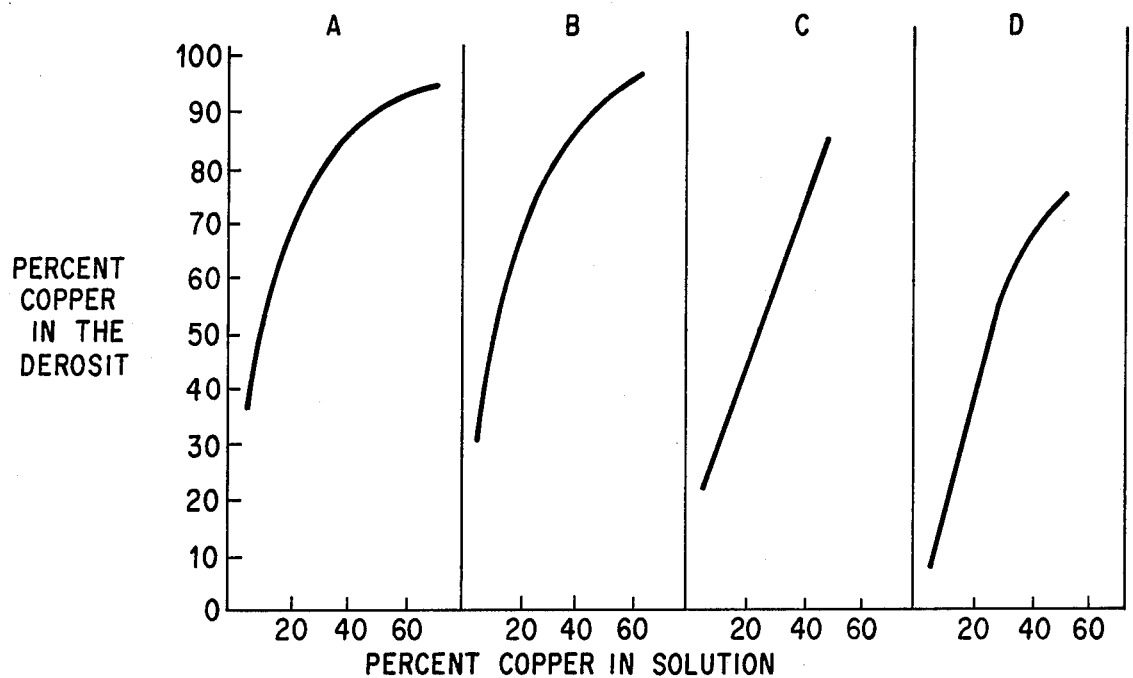
FIG. 1 represents copper concentration in a plating solution relative to copper concentration in an alloy radiation attenuating deposit.

As aforesaid, the invention is the deposition of multiple electroless metal layers over the surface of an electronic base material where the electroless metal layers comprise a first electroless alloy layer rich in copper and containing a member selected from the group of nickel, cobalt and mixtures of nickel and cobalt, and phosphorus and the second electroless metal layer comprises an electroless alloy rich in nickel and/or cobalt and containing copper and phosphorus.

The electronic base material having the electroless metal layers is any housing conventionally used for electronic equipment. The housing is typically fabricated of a dielectric material such as a plastic. The plastics most often used are polycarbonates, acrylonitrile-butadiene-styrene resin (ABS), polypropylene, etc. For purposes of this invention, the term electronic housing or electronic base material is to be construed broadly as any surface requiring shielding to contain electromagnetic radiation.

The coating of a dielectric material such as a plastic with an electroless metal is a process well known in the art. The deposition of electroless alloys comprising copper, nickel and/or cobalt and phosphorus is also known in the art and shown in several patents including U.S. Pat. No. 4,482,596 incorporated herein by reference.

Electroless solutions for depositing alloys of copper, nickel and/or cobalt and phosphorus are alkaline and comprise 1) a source of copper ions, (2) a source of nickel and/or cobalt ions, (3) a complexing agent to maintain said ions in solution, (4) hypophosphite as a reducing agent, and (5) an autocatalytic promoter.

The source of the plating metal ions can be any of the metallic salts conventionally used for electroless plating, sulfates and chlorides of nickel, cobalt and copper being preferred. Additional examples of metallic salts can be found in the literature.

The complexing agents used to maintain the plating metal in solution can be either a single complexing agent for all metals dissolved in solution or a mixture of compatible complexing agents specifically formulated for a mixture of metals in solution. Most complexing agents known in the art for use in electroless copper and nickel are suitable though it has been found that ammonium hydroxide has a tendency to inhibit the deposition of higher concentrations of copper if it is present in solution in excessive concentration.

Preferred complexing agents for such baths are hydroxy substituted carboxylic acids such as gluconic acid, citric acid, sulfosalicylic acid and malic acid; citric acid being most preferred. Other complexing agents are the amine complexing agents, especially alkanolamines, as would be known to the art, though with some alkanolamines, careful controls are necessary. The selection of a suitable pH for a given complexing agent is required The reducing agent required to form alloy of the type contemplated herein is a hypophosphite salt. It is preferably present in a concentration of at least 0.05 moles per liter of solution and more preferably, in a concentration of at least 0.10 moles per liter of solution. Generally, but not necessarily, the hypophosphite is used in molar excess of the plating metal.

The pH of the plating solution is at least 7 and preferably, when using the preferred carboxylic acid complexing agent, varies between about 8.0 and 14.0 and more preferably, between 8.0 and 11. Though a pH between 7 and 8 is usable under carefully controlled conditions, difficulties are encountered at the lower pH, particularly since pH has a tendency to drop as plating proceeds. Any pH adjuster typically used in electroless plating is suitable, though ammonium hydroxide is preferably avoided.

The autocatalytic promoter used in accordance with the procedures of U.S. Pat. No. 4,482,596 is added to the plating solution to render the solution an autocatalytic solution and/or to exalt the plating rate. The mechanism by which the promoter operates is not fully understood, but it is known that when the dissolved copper content in many plating solutions having a pH below 11 exceeds about 5% by weight, dependent upon the specific solution used, the plating rate of the solution drops significantly and plating stops or continued buildup becomes infinitesimally small and the deposit formed is not autocatalytic, the latter phenomena probably accounting for the drop-off in plating rate. For example, a solution at a pH above 10 containing about 5% by weight copper using citric acid as a complexing agent can codeposit copper in amounts ranging between about 5 and 20% by weight of the total alloy deposit in the absence of an autocatalytic promoter. When an inadequate concentration of autocatalytic promoter is added to the solution, at the same solution pH, the concentration of copper in solution can approach about 95% by weight or more, though the concentration of complexing agent must be reduced before the plating rate drops significantly. A plating solution containing between about 50 and 70% dissolved copper deposits alloys having copper in concentrations approaching 95% or more of the total deposit. When the solution contains 95% or more dissolved copper, a deposit is obtained containing 99% copper or more.

Suitable autocatalytic promoters comprise compounds that contain oxy anions. Several of the oxy compounds are substantially more effective than others. Some are ineffective and even detrimental. Salts of carbonates and borates, particularly the alkali and alkaline earth metal salts thereof are especially useful, and those compounds are preferred as autocatalytic promoters. Phosphates, such as sodium orthophosphate and sodium metaphosphate, provide some benefit but are less effective than the carbonates and borates and should be used in higher concentrations. Other useful oxy compounds such as ethylene carbonates, fluoroborates (which are believed to be oxy compounds in hydrated form) and methoxides and ethoxides such as sodium methoxide and ethoxide are also autocatalytic promoters in higher concentrations.

The solution concentration of the autocatalytic promoter can vary within wide limits from a trace to saturation, it being understood that the optimum concentration differs for different promoters. In general, plating rate and the maximum concentration of copper that can be tolerated in solution is affected by the concentration of the promoter in the solution. As promoter concentration increases; plating rate, the maximum concentration of copper that can be tolerated in solution, and the overall permissible pH range increases up to a maximum. In addition, it has been found that higher concentrations of promoter are needed for substrates known to be difficult to plate. Using the above guidelines, the promoter concentration generally varies between about 1 gram per liter and saturation, and more preferably between about 5 and 50 grams per liter.

The concentration of each of the plating metals in solution—i.e., copper, nickel and/or cobalt, is dependent upon the desired alloy and the concentration of the metals in the alloy deposit, it being understood that the greater the concentration of one metal relative to the other in solution, the greater will be its concentration in the deposit. The relationship between concentration of metal in solution and concentration of metal in the alloy deposit can be seen from FIG. 1 of the drawings where copper concentration in solution as a function of copper concentration in the deposit is plotted for several plating solutions having different complexing agents. It should be noted that the copper concentrations in the deposits are disproportionately higher than their corresponding concentrations in solution. This establishes that copper plates from the solution at a faster rate or preferentially to nickel. Consequently, the concentration of copper in solution will exceed the concentration of nickel in the deposit. Accordingly, to obtain an alloy having a concentration of copper of 25% by weight or more would require a copper content in solution in excess of 5% by weight. For those alloys having a copper content in excess of 70% by weight, the copper content in solution should exceed 20% by weight of the total of the plating metals and preferably should exceed 33%. For those alloys having a copper concentration of from 85 to 99% copper, the copper concentration in solution should be as high as possible so long as it is not so high as to cause the deposit to become non-autocatalytic. For example, to obtain an alloy deposit containing in excess of 90% copper, the solution should contain at least 50% copper.

Electroless alloys of the type described above are deposited over a dielectric surface by a pretreatment process involving conditioning and catalyzing of a dielectric surface (the electronic housing base material). Pretreatment typically involves contact with a solution of a solvent for the base material followed by treatment with an oxidizing agent such as a chromate or permanganate solution. Processes of this nature are described in U.S. Pat. No. 4,515,829 incorporated herein by reference. Catalyzing involves contact of the pretreated base material with a noble metal catalytic colloid. Such processes are known in the art and described in numerous patents including, for example, U.S. Pat. No. 3,011,920, also incorporated herein by reference.

In accordance with the subject invention, radiation attenuating shielding is provided over an electronic housing base material using an alloy depositing electroless solution of the type described above. A multilayer electroless deposit is used where a layer in contact with the electroless housing is an alloy of copper-nickel and/or cobalt-phosphorus where the alloy is rich in copper and a top layer is used that is also a copper-nickel and/or cobalt-phosphorus alloy where the deposit is rich in nickel and/or cobalt.

The multilayer shielding may be formed by one of two alternative methods. In the first method, a first electroless alloy is deposited from a plating solution with a relatively large concentration of dissolved copper content to provide a copper rich alloy. The copper content in the solution should be at least 50% of the total of the dissolved metal and preferably, in amounts sufficient to provide a copper-nickel and/or cobalt-phosphorus alloy having a copper content varying from about 75% to 99% of the total deposit with the balance comprising nickel and/or cobalt and phosphorus. Plating continues until a deposit of desired thickness is obtained, typically varying between 10 and 100 millionths of an inch and in a thickness required to provide desired attenuation. Following the formation of this deposit, the part is removed from the plating solution, optionally rinsed in water, and immersed into a plating solution having a high dissolved nickel and/or cobalt content, typically from 80 to 99% nickel and/or cobalt. This solution will deposit an alloy rich in nickel and/or cobalt, typically possessing in excess of 50% nickel and preferably having a nickel content ranging between 60 and 95% of the total deposit with the balance comprising copper and phosphorus. Plating continues until a deposit of desired thickness is obtained, preferably a deposit typically varying between about 10 and 100 millionths of an inch.

Figure 2:
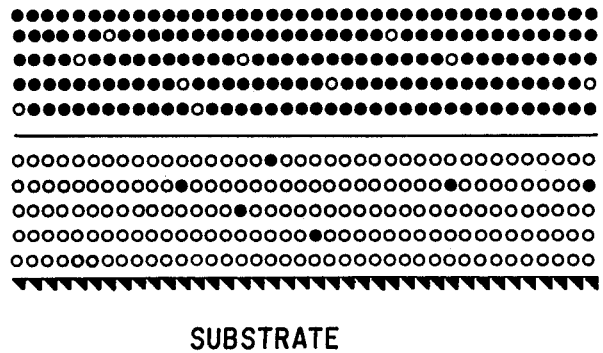
FIG. 2 represents a radiation attenuating coating in exaggerated dimension in accordance with one embodiment of the invention.

The formation of the multiple layers in accordance with the above described embodiment is illustrated in FIG. 2 of the drawings where the solid "o"s represent copper in the deposit and the open "o"s represent nickel and/or cobalt. The process described above is unique in that the copper rich electroless alloy deposit from the first plating solution is autocatalytic to the nickel and/or cobalt rich electroless alloy deposit from the next plating solution. Because of this, it is not necessary to include a step of activation of the electroless deposit for further plating as would be required using conventional plating solutions such as a conventional electroless copper solution followed by a conventional electroless nickel solution. Accordingly, there is a reduction in the number of processing steps and a concomitant decrease in the cost of forming the radiation attenuating or shielding layer.

Figure 3:
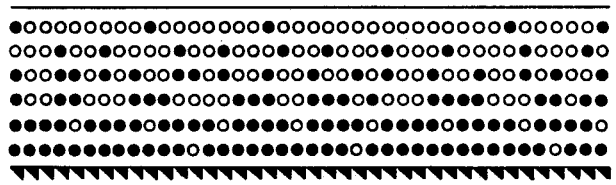
FIG 3 represents a radiation attenuating coating in exaggerated dimension in accordance with an alternative embodiment of the invention.

In an alternative embodiment of the invention, an electroless radiation attenuating shielding in accordance with the present invention is formed from a single plating solution. As described above, copper deposits from the plating solution at a faster rate than nickel or cobalt. Therefore, a deposit may be formed from a single plating solution initially rich in copper. As deposition of the alloy proceeds, copper is depleted at a rate greater than the rate at which nickel and/or copper is depleted whereby the ratio of dissolved copper to nickel and/or cobalt in solution continuously changes and decreases. This results in a change in the concentration of copper relative to nickel and/or cobalt in the alloy deposit as plating continues. Hence, a multilayer deposit is formed having a continuous gradient ranging from rich in copper at the surface of the base material to rich in nickel and/or cobalt at the surface remote from the base material. In this embodiment of the invention, the multilayer deposit comprises an infinite number of layers with the aforesaid continuous gradient in copper and nickel and/or cobalt concentrations. This is illustrated in FIG. 3 of the drawings where again the solid "o"s represent copper in the deposit and the open "o"s represent nickel and/or cobalt.

A radiation attenuating layer having a continuous gradient as described above involves fewer processing steps since a single plating solution is used. However, this embodiment is the lesser preferred embodiment of the invention because it involves a constantly changing metal content in the metal plating solution with a concomitant changing copper to nickel ratio in solution. These changing variables make the electroless plating solution difficult to control which can lead to undesirable deposit properties. The disadvantages can in part be mitigated by a carefully maintained replenishment schedule.

Following formation of the radiation attenuating shielding layer, the metal plated base material may be treated with an additional treatment solution to form a corrosion resistant conversion coating. Such a treatment solution comprises an aqueous solution of $Cr^{+6}$ ions in a concentration of from 1 to 50 weight percent and preferably from 5 to 10 weight percent. The source of the chromium ions is a solution soluble chromium salt such as chromium acid anhydride, sodium dichromate or potassium dichromate. The time of immersion in the solution can vary within wide limits and typically comprises from about 1 to 10 minutes. Treatment time may vary from about room temperature to 150° F. The chromium ions form a thin nickel chromium conversion coating over the nickel rich alloy layer to significantly improve corrosion resistance of the nickel layer. In this respect, resistance to salt spray is approximately doubled by the chromium treatment.

The invention will be better understood by reference to the examples which follow where an ABS test plaque measuring 6 inches by 8 inches was used for purposes of illustration. In the examples, all chemicals used were available from Shipley Company Inc of Newton, Mass., unless indicated otherwise, and the following plating sequence was used:

(1) immerse part in PM-940(a) etch for 10 minutes at a temperature about 155° F. and water rinse;

(2) immerse part in PM-954(b) neutralizer for 3 minutes at a temperature about 120° F. and water rinse;

(3) immerse part in PM-958(c) catalyst solution for 3 minutes at a temperature of about 110° F. and water rinse (4) immerse part in PM-964(d) accelerator solution for 2 minutes at a temperature of about 120° F. and water rinse;

(5) immerse part in Formulation I (described below) for 15 minutes at a temperature of about 140° F. and water rinse; and (6) immerse part in Formulation II (described below) for 5 minutes at a temperature of about 140° F. and water rinse.

a. Chromic-sulfuric acid etchant.
b. Aqueous solution of an amine reducing agent.
c. Aqueous tin palladium colloid.
d. Aqueous acid solution.

EXAMPLE 1

The following two solutions were prepared:

| Formulation I | |
|---|---|
| cupric sulfate pentahydrate | 8 grams |
| nickel sulfate hexahydrate | 4 grams |
| citric acid | 24 grams |
| sodium hypophosphite monohydrate | 20 grams |
| potassium tetraborate decahydrate | 15 grams |
| Surfactant[1] | 1 gram |
| potassium hydroxide | to pH 10.2 |
| water | to 1 liter. |
| Formulation II | |
| cupric sulfate pentahydrate | 0.5 grams |
| nickel sulfate hexahydrate | 11.5 grams |
| citric acid | 24.0 grams |
| sodium hypophosphite monohydrate | 20.0 grams |
| potassium tetraborate decahydrate | 15.1 grams |
| Surfactant[1] | 1.0 gram |
| potassium hydroxide | to pH 10.2 |
| water | to 1 liter. |

[1] Cat-floc T-1.

An ABS part was prepared in accordance with the procedure set forth above with plating first from Formulation I and then from Formulation II to provide shielding comprising a first coating having a copper content of about 95% of the metals and a nickel content of about 5% of the metals. Phosphorus comprised about 3% by weight of the total metal content. The first coating had a thickness of 10.5 millionths of an inch. The deposit formed from Formulation II had a metals content of 21% copper and 79% nickel with a similar phosphorus content. The deposit formed from Solution 2 had a thickness of about 7 millionths of an inch.

EXAMPLE 2

The part prepared in accordance with Example 1 may be immersed in a 10 percent by weight chromic acid solution for a period of 10 minutes at a temperature of 120° F. to form a nickel chromium conversion coating having corrosion resistance properties improved over that of the electroless alloy deposit rich in nickel alone.

EXAMPLE 3

The procedure of Example 1 may be repeated with one half of the nickel sulfate replaced by cobalt sulfate with similar results obtained.

EXAMPLE 4

The procedure of Example 1 may be repeated with all of the nickel sulfate replaced by an equal amount of cobalt sulfate with similar results obtained.

EXAMPLE 5

The procedure of Example 1 may be repeated using only Formulation 1 and increasing the plating time to 30 minutes to provide a single layer rich in copper at the interface with the ABS and rich in nickel at the top surface.

We claim:

1. An electronic base material having an electromagnetic radiation attenuating coating, said base material having a dielectric surface coated with an electroless alloy metal coating where
   a. a first electroless alloy metal coating in contact with the surface of the base material is an alloy of copper, a member selected from the group consisting of cobalt, nickel and mixtures of cobalt and nickel, and phosphorus with a predominant proportion of the metal copper, and
   b. a second electroless alloy metal coating furthest remote from the surface of the base material is an alloy of copper, a member selected from the group consisting of cobalt, nickel and mixtures of cobalt and nickel and phosphorus with a predominant proportion of the metal nickel, cobalt or a mixture of the two, said first and second electroless alloy coatings being in contact with each other.

2. The electronic base material of claim 1 where the first electroless alloy metal coating has a copper concentration of at least 70 weight percent of the total alloy with nickel and phosphorus comprising the balance of the alloy.

3. The electronic base material of claim 2 where the copper concentration varies between 95 and 99 weight percent.

4. The electronic base material of claim 1 where the first electroless alloy metal coating has a copper concentration of at least 70 weight percent of the total alloy with cobalt and phosphorus comprising the balance of the alloy.

5. The electronic base material of claim 1 where the second electroless alloy metal coating has a concentration of the member selected from the group consisting of nickel, cobalt and mixtures thereof of at least 50 weight percent of the total alloy with copper and phosphorus comprising the balance of the alloy.

6. The electronic base material of claim 5 where the member from the group is nickel.

7. The electronic base material of claim 6 where the nickel concentration varies between 60 and 95 weight percent.

8. The electronic base material of claim 5 where the member from the group is cobalt.

9. The electronic base material of claim 8 where the cobalt concentration varies between 60 and 95 weight percent.

10. The electronic base material of claim 1 where the electromagnetic radiation attenuating coating is a single layer having a plurality of layers having a copper concentration gradient.

11. The electronic base material of claim 1 where the first layer in contact with the electronic base material is rich in copper and a second layer furthest remote from the surface of the electronic base material is rich in a member selected from the group consisting of nickel, cobalt and mixtures thereof.

12. The electronic base material of claim 1 where the top surface furthest remote from the electronic base material comprises a conversion coating of chromium and a member selected from the group consisting of nickel, cobalt and mixtures thereof.

* * * * *